United States Patent [19]

Brown

[11] Patent Number: 4,797,630
[45] Date of Patent: Jan. 10, 1989

[54] TWO STAGE PUSH-PULL MOSFET POWER AMPLIFIER

[76] Inventor: Albert W. Brown, 622 Commercial Ave., #4, S. San Francisco, Calif. 94080

[21] Appl. No.: 846,951

[22] Filed: Apr. 1, 1986

[51] Int. Cl.[4] .............................................. H03F 3/30
[52] U.S. Cl. ...................................... 330/264; 330/298
[58] Field of Search ............ 330/123, 200, 202, 207 P, 330/264–267, 297, 298

[56] References Cited

U.S. PATENT DOCUMENTS

| 3,042,875 | 7/1962 | Higginbutham | 330/265 X |
| 4,159,450 | 6/1979 | Hoover | 330/264 |
| 4,464,634 | 8/1984 | Velazquez | 330/264 |
| 4,630,164 | 12/1986 | Olsson | 330/264 X |

FOREIGN PATENT DOCUMENTS

| 55712 | 4/1985 | Japan | 330/264 |

OTHER PUBLICATIONS

Rule, "The 'Winton' Stereo Amplifier", *Practical Wireless*, Mar. 1979, pp. 39–47.

*Primary Examiner*—James B. Mullins
*Attorney, Agent, or Firm*—Harris Zimmerman; Howard Cohen

[57] ABSTRACT

A power amplifier includes an output stage comprising a pair of complementary MOSFET power transistors connected in push-pull fashion between the positive and negative poles of a split DC power supply, with the sources of the transistors connected together to ground. The input stage includes another pair of complementary MOSFET driver transistors having their gates connected together to the input signal. The drain signal of each of the driver transistors is resistor coupled to the gate of one of the power transistors, and biased so that the driver turns off as the power transistors turns on. The amplifier output signal is taken between the common point of the split DC power supply and ground.

12 Claims, 2 Drawing Sheets

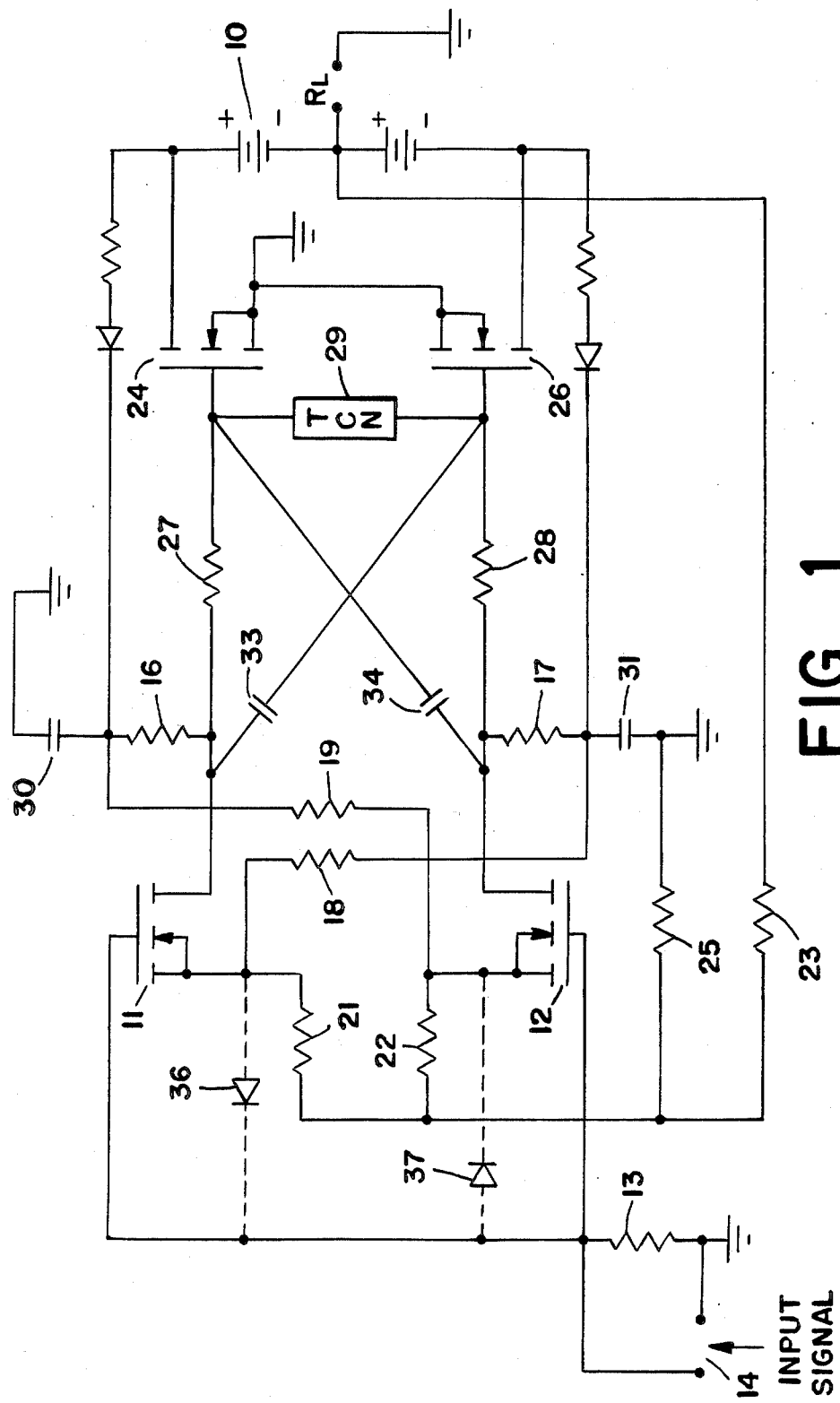
FIG_1

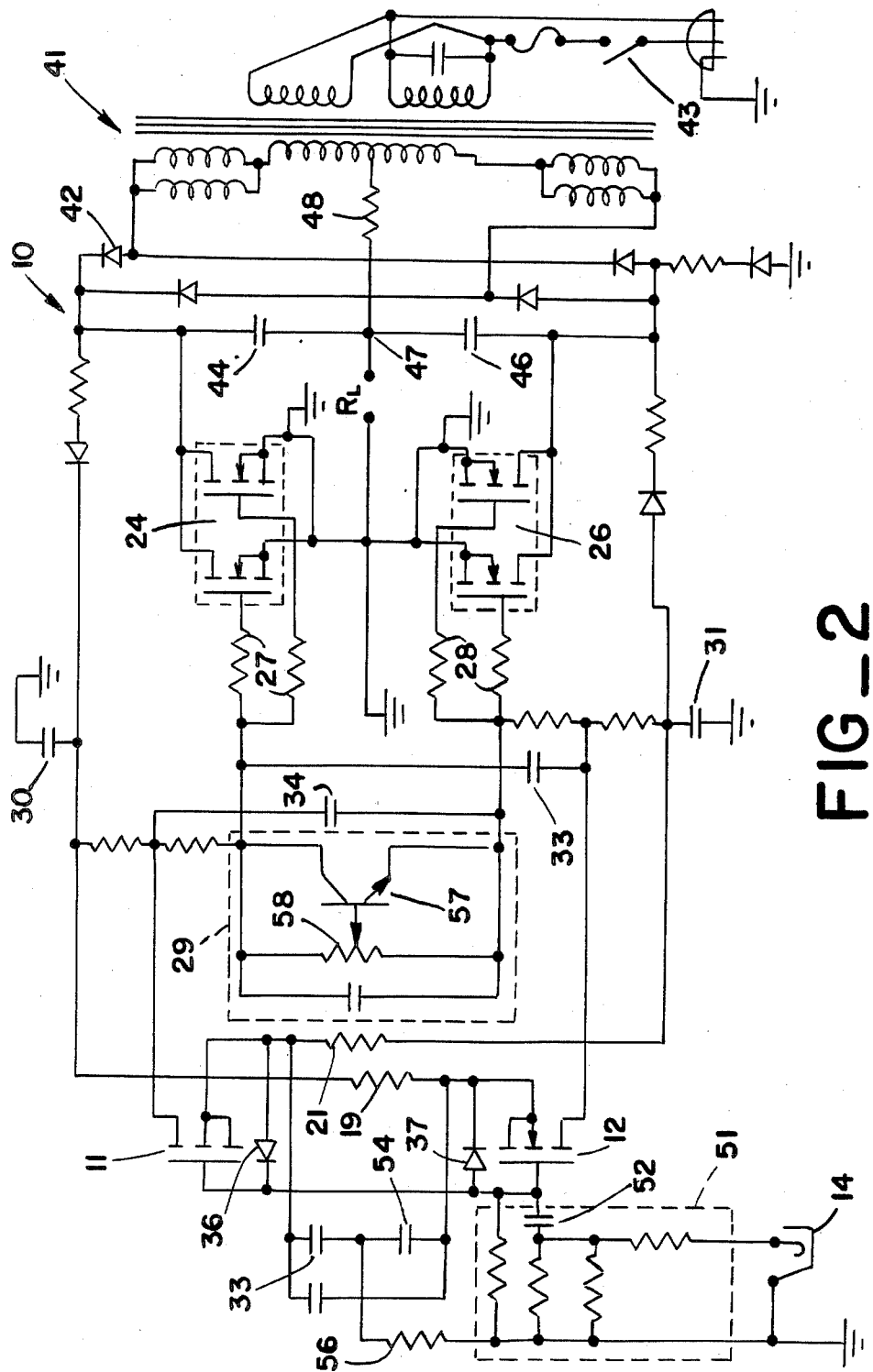
FIG_2

TWO STAGE PUSH-PULL MOSFET POWER AMPLIFIER

BACKGROUND OF THE INVENTION

In the field of high power amplifiers, especially for audio use, the amplifiers are notoriously short lived. This phenomenon is due in large part to the applications to which high power audio amplifiers are put. For example, many such amplifiers are used in the live performance of popular and rock and roll music. It is common to purposely overdrive the amplifiers to clip and distort the output signal, thus emphasizing the signal harmonics at the expense of the signal fundamental. Also, in such uses the amplifiers are generally operated at full output for extended periods. This tends to create high operating temperatures.

In prior art amplifiers, the last driver stage that drives the output transistors turn the output transistors on when they are turned on themselves. They either draw current through a resistance across a MOSFET to apply gate voltage, or they draw current through a base to apply base current from the device that is driving. In prior art designs, if the drivers draw more current they cause the output transistors to draw more current, in cascade fashion, and lead to thermal runaway. Negative feedback can be used to counteract the thermal runaway problem, but this introduces further complications by altering the output signal characteristic.

Most solid state amplifiers are not designed to overdrive and distort without severe problems in addition to thermal runaway. The common result is either damage to the amplifiers or destruction of the loudspeakers. To protect the amplifier, many manufacturers have added protection devices, termed energy limiting or VI protection. These devices generally limit the output current at a threshold set by the recent value of the output signal voltage and current. Although this would appear to be a useful technique, it also leads to further problems. At high output levels, the signal current is constantly being limited in erratic fashion, leading to wild fluctuations in the output impedance (the ratio of V/I). This causes impedance mismatches with the loudspeakers.

The output impedance of a typical amplifier in the operating mode can be as little as 7 milliohms in series with less than 3 microhenries. The impedance can jump to several thousand ohms. When the loudspeaker cone being driven by the amplifier relaxes, the voice coil moving through the magnetic gap can generate a substantial back current. If the output impedance of the amplifier is sufficiently high, the result is a voltage signal which drives the amplifier. This flyback pulse returns the inductive energy of the load to the opposite polarity power supply of the amplifier with respect to the side that produced the excessive output. The result is a rasping, popping sound which is very disturbing.

Furthermore, the VI protection circuits for many amplifiers will start putting a direct current into the speaker. They often generate an off-center DC voltage at the output when they are being overdriven. The direct current output causes the loudspeaker cone to shift from its nominal resting position, and thus limits the further excursions of the cone required to transduce the output signal.

The typical response to these drawbacks of the prior art amplifiers has been to add further circuitry to alleviate these negative effects. As a general result, the circuitry of audio power amplifiers has become enormously complex, leading to very high numbers of components and attendant high costs. This also leads to more difficulties in servicing of damaged amplifiers.

Due to the nature of live performance popular and rock and roll music, the power amplifiers also suffer from physical abuse. Many music groups perform on tours, and the sound equipment is set up and taken down almost daily. Considering the skill levels of some road crews, this situation is rife with opportunities for misconnections (i.e., connecting the amplifier output to the input jack), ground faults which input 60 cycle hum directly into the amplifier, direct short circuits of the output, and the like. No prior art amplifier design can withstand such treatment.

SUMMARY OF THE PRESENT INVENTION

The present invention generally comprises a two-stage push-pull MOSFET power amplifier which overcomes the drawbacks of prior art devices described above. Salient features of the invention include the elimination of UI circuit protection, the elimination of thermal runaway problems, the ability to tolerate short circuiting of the output, and the like.

The power amplifier includes an output stage comprising a pair of complementary MOSFET power transistors connected in push-pull fashion with the sources of the transistors connected together to ground and the drains connected between the positive and negative poles of a split DC power supply. The input stage includes another pair of complementary MOSFET driver transistors having their gates connected together to the input signal. The drain signal of each of the driver transistors is resistor coupled to the gate of one of the power transistors, and biased so that the driver turns off as the power transistors turns on. The amplifier output signal is taken between the common point of the split DC power supply and ground. Overloads at the output tend to reduce the power supply to the driver stage, thus limiting the output to a safe level and providing intrinsic output limiting without additional protection circuitry.

BRIEF DESCRIPTION OF THE DRAWING

FIG. 1 is a schematic view of a simplified form of the power amplifier of the present invention.

FIG. 2 is a schematic view of a practical embodiment of the power amplifier of the present invention.

DESCRIPTION OF THE PREFERRED EMBODIMENT

The present invention generally comprises a two stage, push-pull MOSFET amplifier adapted for use in the DC to one megahertz range. It is particularly well suited for high output audio applications, due to its linearity, low distortion characteristics, and intrinsic circuit protection from overdriving conditions.

With regard to FIG. 1, a simplified form of the invention includes a power supply 10 comprising a split DC source having positive, negative, and common terminals. The positive and negative legs are decoupled or returned to ground through capacitors 30 and 31, respectively. The input stage of the amplifier comprises a pair of complementary MOSFET driver transistors 11 and 12. The gates of these two transistors are directly connected together, and are also connected to one side of the input jack 14. The gates are also connected through resistor 13 to ground, which forms the other side of the input jack 14. Thus the input signal is applied directly to the gates of the input stage driver transistors.

The drain voltage for the input stage is supplied to transistor 11 through resistor 16 which is connected to the positive side of the power supply, and to transistor 12 through resistor 17 which is connected to the negative side of the power supply. The source return current to bias transistor 11 into conduction is supplied through resistor 18 from the negative side; likewise, the source return current to bias transistor 12 into conduction is supplied through resistor 19 from the positive side of the supply. The sources of transistors 11 and 12 are connected together through resistors 21 and 22, respectively; this connection provides a low impedance path to ground through resistor 25, and a degenerative feedback path through resistor 23 and thence to the common terminal of the supply, as will be explained in the following.

The output stage of the amplifier includes a pair of complementary MOSFET power transistors 24 and 26 having their sources connected directly together and directly to ground. The drain of driver transistor 11 is connected by resistor 27 to the gate of transistor 24; both of these transistors are the same type (N-channel). Likewise, the gate of output transistor 26 is connected through resistor 28 to the drain of driver transistor 12, and both the latter transistors are P-channel type devices. The drains of the output transistors 24 and 26 are connected directly to the positive and negative sides of the supply, respectively. It is significant to note that the amplified output signal is applied to the load $R_L$ directly from the common terminal of the supply.

A temperature compensation network 29 is connected between the gates of the output power transistors 24 and 26. The characteristics of the network 29 are determined so that the voltage drop across the network is equal to the sum of the gate/source voltage drops across output transistors 24 and 26 required to produce a desired mutual drain current when there is zero current flowing through the load resistance. This network may be assumed to be a resistive impedance circuit, and may take any convenient form, as is apparent to any individual having ordinary skill in the art.

The operation of the simplified embodiment of the invention of FIG. 1 is as follows. The values of resistors 18 and 21, and 19 and 22, are chosen so that when the voltage at the input terminal 14 is zero, the drain-ground voltages of transistors 11 and 12 are equal to one half the positive and negative voltages of the supply, respectively. Resistors 27 and 28 are equal, so that the gate of transistor 24 will have a positive voltage with respect to ground equal in magnitude to the voltage of the gate of transistor 26 with respect to ground. When a positive signal voltage is applied to the input terminal 14, the current in transistor 11 through resistor 16 increases and the current in transistor 12 through resistor 17 decreases. This situation causes the voltage applied to the gate of transistor 24 through resistor 27 to decrease while the voltage applied to the gate of transistor 26 through resistor 28 is increased. As a result, drain current in transistor 24 is decreased, and drain current in transistor 26 is increased. This current imbalance causes current flow through the load resistor $R_L$ to ground, and generates a positive voltage across the load.

When a negative signal is applied to the input terminal 14, the entire process described above is reversed. Transistor 12 becomes conductive and transistor 11 turns off, causing output transistor 24 to conduct and output transistor 26 to turn off. The result is current flow from transistor 24 through the load resistor, and a negative voltage to appear across the load resistor. It is significant to note that each driver transistor operates in a mode opposite to the mode of its associated output transistor. This factor provides intrinsic protection against thermal runaway, and other instabilities typical of prior art amplifier designs.

It is well established that the input resistance of MOSFET devices is virtually infinite. Thus there is virtually no signal attenuation of the signals appearing at the drains of transistors 11 and 12 due to the presence of resistors 27 and 28. The changes in voltage on the drains of transistors 11 and 12 are equal and in phase, and the only attenuation is caused by the internal capacitance of the output power transistors 24 and 26. This attenuation, if noticeable, can be compensated by the addition of cross-coupling capacitors 33 and 34 connected across the gate drives of the output transistors.

It may be desirable to provide some protection for the gates of the input transistors 11 and 12. Although the gate resistance is virtually infinite, the gates break down at approximately 15 volts and are quickly destroyed. Diodes 36 and 37 may be connected between the source and gate of each of the input transistors 11 and 12, respectively. These diodes are biased out of conduction by the on-bias of the respective transistor, and begin to conduct only when a signal voltage sufficient to completely saturate the driver transistors is applied to the input terminal 14.

A further embodiment of the present invention, depicted in FIG. 2, is a full layout of the simplified circuit of FIG. 1. Many of the components are the same, and have been provided with the same reference numerals. The power supply 10 is configured using a center-tapped isolation transformer 41 feeding a bridge rectifier 42. Filter capacitors 44 and 46 are connected between the positive and negative ends of the bridge rectifier 42, and the junction of the capacitors forms the common terminal 47 of the split DC supply. The load resistance is connected between the common terminal 47 and ground. A high power dissipating resistor 48 is connected between the common point 47 and the center tap terminal of the transformer, so that the power supply, comprising essentially the capacitors 44 and 46, floats about a nominal zero point established by the center tap reference. A switch 43 in the primary winding power circuit provides on-off control of the amplifier.

The input resistor 13 of FIG. 1 is replaced in the embodiment of FIG. 2 by a series-parallel resistor network 51, with a capacitor 52 coupling the input signal to the gates of the input transistors to block any DC input component. The input end further includes a pair of negative feedback capacitors 53 and 54 connected between the sources of the input transistors 11 and 12, with the common junction of the feedback capacitors connected through resistor 56 to ground.

The temperature compensation network 29 is configured in FIG. 2 with a bipolar transistor 57 having its emitter-collector circuit connected across the gate drives of the output power transistors 24 and 26. The base is connected to a variable resistor 58 extending across the emitter-collector circuit, the resistor being adjustable to bias the transistor 57. This network establishes a voltage drop between the gate drives of the output transistors, and this voltage drop is a function of the temperature dependent resistance of the emitter-collector circuit of the transistor 57. As the temperature of transistor 57 increases, the voltage drop decreases, and current and gain in the output stages are reduced. Thus any tendency toward thermal runaway is countered effectively. The transistor 57 may be mounted proximate to the output power transistors, which generally dissipate the most heat in an amplifier circuit.

In the embodiments of FIGS. 1 and 2, a significant feature of the amplifier is the manner in which the power supply arrangement is connected in relation to the signal output and the biasing scheme of the driver stage. The filter capacitors 44 and 46 are connected directly to the ground return of the supply, which is essentially the output of the amplifier, but the center tap of the transformer returns to that point through the fairly large resistor 48. The filter caps connect the drains of the output transistors directly to the load, so that the signal voltage encounters only the low impedance of the filter capacitors. This provides a DC charging path, so that the voltages across the capacitors are essentially equal.

It may be noted that the positive half and negative half of amplifier chain are essentially identical, and currents are balanced in both the input driver stage and output stage. In addition, the power supply derivation for the input driver stage is taken from the output circuit to provide some DC degeneration, and this factor tends to balance the amplifier in several important ways. This power supply relationship is established by the sources of the input transistors being powered by the output stage; e.g., the sources of transistors 11 and 12 are connected through resistors to the filter capacitors 46 and 44, respectively, in FIG. 2. If the output stage on one side (positive or negative) has slightly more gain than the other side, it will tend to draw more current at idle, which will tend to unbalance the output toward the negative direction. That circumstance will tend to decrease the amount of voltage being supplied to the driver stage, which will decrease gain and tend to balance the gain of the two push-pull sides. It is a feedback loop of an unusual sort, in that it operates at frequencies below the passband of the amp. It may be termed a feedback loop having a negative gain characteristic. The filter capacitors are sized so that their rolloff frequency is about 1/5 the rolloff of the amp as determined by the input capacitors.

The same stabilizing effect pertains to asymmetric input signals, in which the positive or negative portion of the waveform is unequal to the opposite side of the waveform. In prior art amplifiers, e.g., the "spike" portion of the waveform may overdrive the output stage, resulting in clipping of the output signal and the introduction of undesirable harmonics, reduced fidelity, and the like. The supply recenters as explained above and puts a voltage drop on the load resistor because it is on the side of the waveform that has a shallow peak and a long duty cycle for a greater time than it is on the opposite side of the cycle, so that the corresponding supply voltage will drop and the other one will rise. The net effect is that the "head room", or ability to reproduce sharp signal peaks, shifts to accommodate such peaks. Thus distortion at high output levels is minimized.

Another very unusual achievement of the circuit design of the present invention is that the output can be shorted without destroying the amplifier. The amount of signal that can be applied to the outputs is proportional to the amount of signal that the outputs can supply. When shorted, the output signal is zero, the power to the driver stage falls, and the driver signal falls also. This is due to the capacitors in the power supply, which are pulled to zero voltage by a short, thus squelching the driver stage entirely. By using a relatively small set of filter capacitors and a fairly high quality transformer the circuit achieves direct output protection without added circuitry. This is a great contrast to prior art amplifiers, which are laden with protection circuits and networks; yet most prior art amplifier designs are incapable of withstanding a direct short across the load, without at least destroying the output power transistors.

A further significant feature of the present invention is that as the transistors are driven farther into conduction, in both the driver and the output stages, the gain tends to drop off. That is, the transistors have maximum gain at low output levels. At larger signal levels the gain falls. Since the driver transistors are turning off to drive the output transistors, the driver gain is increasing as the signal level increases, and as they turn on more their gain falls. The total gain is the product of the two stages, and the gain changes of the two stages tend to offset. Thus it is not necessary to use negative feedback to obtain a linear characteristic. In open loop conditions, the amplifier has less than 1% distortion, due to the opposed operation of the stages.

The present invention does include the input circuit protection afforded by the diodes 36 and 37. The two diodes do not come into action until the amplifier is clipping about 20% off the top of the wave, and then they begin to conduct. As soon as the voltage on the transistors exceeds a negative value equal to the forward bias voltage of the transistor plus about 0.6 v, the diodes begin to conduct. This causes the input coupling capacitors 53 and 54 to charge up, turning on both driver transistors 11 and 12 fairly hard. The driver drain voltages go down and bias the output stages off. So if there is a very heavy overdriving signal (more than 100% overdrive at the input), it simply shuts off the output current. Since the driver supply capability and the drain resistors on the drivers are such that the saturation current of the driver transistors is quite low, there is nothing endangered or taken past its limits. It the power supply is not powered up, then the voltage drops of the two input diodes protect the circuit.

Due to the fact that the burden of excessive protection circuitry has been eliminated in the design of the present invention, a salient result is that the component count of the practical embodiment of FIG. 2 is approximately ⅓ of any comparable amplifier available in the commercial market. The present invention employs virtually neutral feedback loops so that the amplifier does not act like a negative resistance when connected to inductive and capacitive loads, and does not oscillate when connected to other load conditions. In this invention the negative-going gain feedback loop stays in operation whether the amplifier is driving the load or the load is driving the amplifier. That is, the amplifier does not have a radically shifting impedance characteristic, and is able to accommodate load flyback without generating DC output levels, pops and static, and the like.

The net result of all the qualities noted herein is that the amplifier of the present invention has a clean and undistorted sound at all output levels. Furthermore, it is less expensive than comparable devices, more rugged under severe operating conditions, and more protective of the loudspeakers connected to the output.

I claim:

1. A power amplifier comprising; an output stage including a pair of complementary MOSFET power transistors connected in push-pull fashion with the sources thereof connected together, a split DC power supply having positive, negative, and common terminals, said power transistors each having a drain connected to one of the positive and negative poles of said power supply, input stage means for driving the gates of said power transistors, said power transistors defining an output signal path from the drain portions thereof through said power supply to a load impedance connected to said common terminal of said power supply, a ground connection, wherein the load impedance is connected between said common terminal of said power supply and said ground connection, said power supply including a center tapped transformer connected to drive a bridge rectifier, and further including resistive means for connecting the center tap connection of said transformer to said common terminal of said power supply.

2. The power amplifier of claim 1, further including a pair of filter capacitors, each connected between either the positive or negative side of said bridge rectifier and said common terminal, said filter capacitors functioning both as output signal paths from said drains of said power transistors and as a floating power supply for said output stage power transistors and said input stage means.

3. A power amplifier comprising; an output stage including a pair of complementary MOSFET power transistors connected in push-pull fashion with the sources thereof connected together, a split DC power supply having positive, negative, and common terminals, each of said pair of power transistors having a drain connected to a respective one of said positive and negative terminals of said power supply, input stage means for driving the gates of said power transistors, said power transistors defining an output signal path from the drain portions thereof through said power supply to load impedance connected to said common terminal of said power supply, said input stage means including a pair of MOSFET driver transistors having gates connected together and to an input signal, and each having a drain connected to the gate of one of said power transistors, means for biasing each of said driver transistors to operate in the reverse conduction mode with respect to the associated power transistor connected to the drain thereof, whereby as each of said driver transistors is driven by said input signal toward increasing conduction it drives the associated power transistor toward increasing non-conduction, and as each of said driver transistors is driven by said input signal toward decreasing conduction it drives the associated power transistor toward increasing conduction.

4. The power amplifier of claim 3, wherein the power source for said driver transistors includes a resistive connection between sources of each of said driver transistor and said common terminal of said power supply.

5. The power amplifier of claim 3, wherein said connection of the drain of each of said driver transistors to the gate of one of said power transistors determines that each driver transistor is operatively connected to one of said power transistors.

6. The power amplifier of claim 3, wherein said driver transistors include source connections, and further including means for protecting said amplifer from short circuit load conditions, including a power supply connection extending from said common terminal of said power supply to said source connections of said driver transistors, whereby a short circuit in the load impedance effectively removes power from said source connections in said driver stage means.

7. The power amplifier of claim 3, wherein said driver transistors include source connections, and said input stage means further includes feedback capacitor means connected between said source connections of said driver transistors.

8. The power amplifier of claim 3, wherein said power transistors include gate connections, and further including temperature compensation network means connected between said gate connections of said power transistors to substantially balance the magnitude of the absolute value of the drive voltages on said power transistor gates.

9. The power amplifier of claim 3, further including feedback loop means extending from said power supply to said input stage means, said feedback loop having a degenerative, negative gain characteristic, said feedback loop including a pair of resistive paths, each connected between the source of one of said driver transistors and the common terminal of said power supply.

10. A power amplifier, comprising; an output stage including a first pair of complementary MOSFET power transistors connected in push-pull fashion, a second pair of complementary MOSFET driver transistors connected in push-pull fashion, means for conducting a signal to said second pair of transistors, first signal path means extending from the drain of each of said driver transistors to the gate of an associated one of said power transistors, power supply means for biasing said first and second pair of transistors so that as each driver transistor is driven toward conduction by said signal the associated power transistor is driven toward non-conduction, and cross-signal path means extending from the drain of each of said driver transistors to the gate of the non-associated power transistor.

11. The power amplifier of claim 10, said power supply means including a split DC power supply having positive, negative, and common terminals, said driver transistors having source connections, and negative gain feedback means comprising a resistive connection from the source connections of said driver transistors to the common terminal of said power supply to decrease the gain of said driver transistors as the signal passing therethrough increases.

12. A power amplifier comprising; an output stage including a pair of complementary MOSFET power transistors connected in push-pull fashion with the sources thereof connected together, a split DC power supply having positive, negative, and common terminals, said power transistors each having a drain connected to one of the positive and negative terminals of said power supply, input stage means for driving the gates of said power transistors, said power transistors defining an output signal path from the drain portions thereof through said power supply to a load impedance connected to said common terminal of said power supply, a ground connection, and DC isolation means connected between said ground connection and said positive and negative terminals of said power supply, said load impedance connected between said common terminal of said power supply and said ground connection, a pair of capacitor means, each connected between either the positive or negative side of said power supply and said common terminal, said capacitor means functioning both as output signal paths from said drains of said power transistors and as a floating power supply for said output stage power transistors and said driver stage means.

* * * * *